US012429513B2

(12) United States Patent
Miron

(10) Patent No.: US 12,429,513 B2
(45) Date of Patent: Sep. 30, 2025

(54) METHOD AND SYSTEM FOR DYNAMIC FAULT DETECTION IN AN ELECTRIC GRID

(71) Applicant: ELECTRICAL GRID MONITORING LTD., Rosh Haayin (IL)

(72) Inventor: Eyal Miron, Hod-Hasharon (IL)

(73) Assignee: ELECTRICAL GRID MONITORING LTD., Yavne (IL)

( * ) Notice: Subject to any disclaimer, the term of this patent is extended or adjusted under 35 U.S.C. 154(b) by 1107 days.

(21) Appl. No.: 16/308,488

(22) PCT Filed: Jun. 4, 2017

(86) PCT No.: PCT/IB2017/053298
§ 371 (c)(1),
(2) Date: Dec. 10, 2018

(87) PCT Pub. No.: WO2017/216673
PCT Pub. Date: Dec. 21, 2017

(65) Prior Publication Data
US 2019/0271731 A1      Sep. 5, 2019

Related U.S. Application Data

(60) Provisional application No. 62/349,161, filed on Jun. 13, 2016.

(51) Int. Cl.
*G01R 31/08* (2020.01)
*G01R 15/14* (2006.01)
*G01R 19/25* (2006.01)

(52) U.S. Cl.
CPC ......... *G01R 31/086* (2013.01); *G01R 15/142* (2013.01); *G01R 19/2513* (2013.01)

(58) Field of Classification Search
CPC .................................................. G01R 31/086
See application file for complete search history.

(56) References Cited

U.S. PATENT DOCUMENTS

| 5,216,226 A | * | 6/1993 | Miyoshi | F24F 11/00 219/497 |
| 5,600,526 A | * | 2/1997 | Russell | G01R 31/086 361/65 |
| 6,006,016 A | * | 12/1999 | Faigon | G06F 11/2252 714/39 |

(Continued)

FOREIGN PATENT DOCUMENTS

| AT | 508834 B1 | 9/2012 |
| CN | 102928751 B | 2/2013 |

(Continued)

*Primary Examiner* — Hyun D Park
(74) *Attorney, Agent, or Firm* — AlphaPatent Associates Ltd.; Daniel J. Swirsky

(57) ABSTRACT

A system for detecting a fault in an electric grid, including a plurality of grid measuring devices distributed in the electric grid, being operative to measure current and/or voltage with their respective time of occurrence, enabling a user to define at least one fault type, and at least one rule for detecting the fault type, the rule associating the fault type with at least one of the measurements, executing the measurements, and analyzing the measurements according to the rule to detect a fault.

17 Claims, 7 Drawing Sheets

(56) References Cited

U.S. PATENT DOCUMENTS

| | | |
|---|---|---|
| 6,798,211 B1 | 9/2004 | Rockwell et al. |
| 2009/0088989 A1 | 4/2009 | Guzman-Casillas |
| 2009/0187344 A1 | 7/2009 | Brancaccio et al. |
| 2010/0315092 A1 | 12/2010 | Nacson et al. |
| 2011/0153236 A1 | 6/2011 | Montreuil et al. |
| 2012/0086459 A1 | 4/2012 | Kim |
| 2013/0090875 A1* | 4/2013 | Takeuchi ............... G01R 17/12 |
| | | 702/72 |
| 2015/0204935 A1 | 7/2015 | Klonowski et al. |

FOREIGN PATENT DOCUMENTS

| | | |
|---|---|---|
| EP | 2377217 B1 | 5/2016 |
| EP | 2686691 B1 | 8/2018 |
| JP | H06162381 A | 6/1994 |
| JP | H0743410 A | 2/1995 |
| JP | H08172719 A | 7/1996 |
| JP | 2004053361 A | 2/2004 |
| JP | 2005121434 A | 5/2005 |
| JP | 2006323440 A | 11/2006 |
| JP | 2011122939 A | 6/2011 |

* cited by examiner

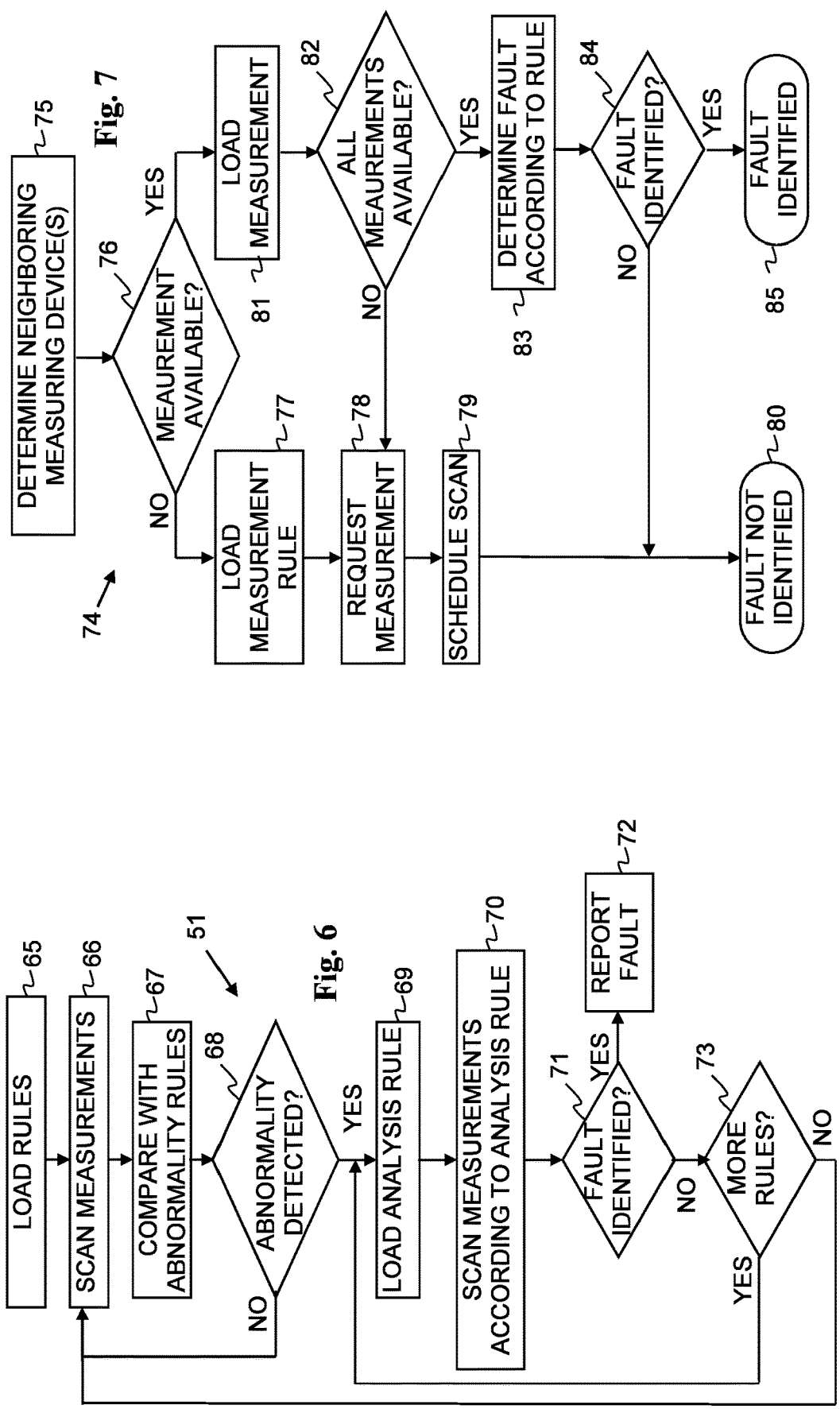

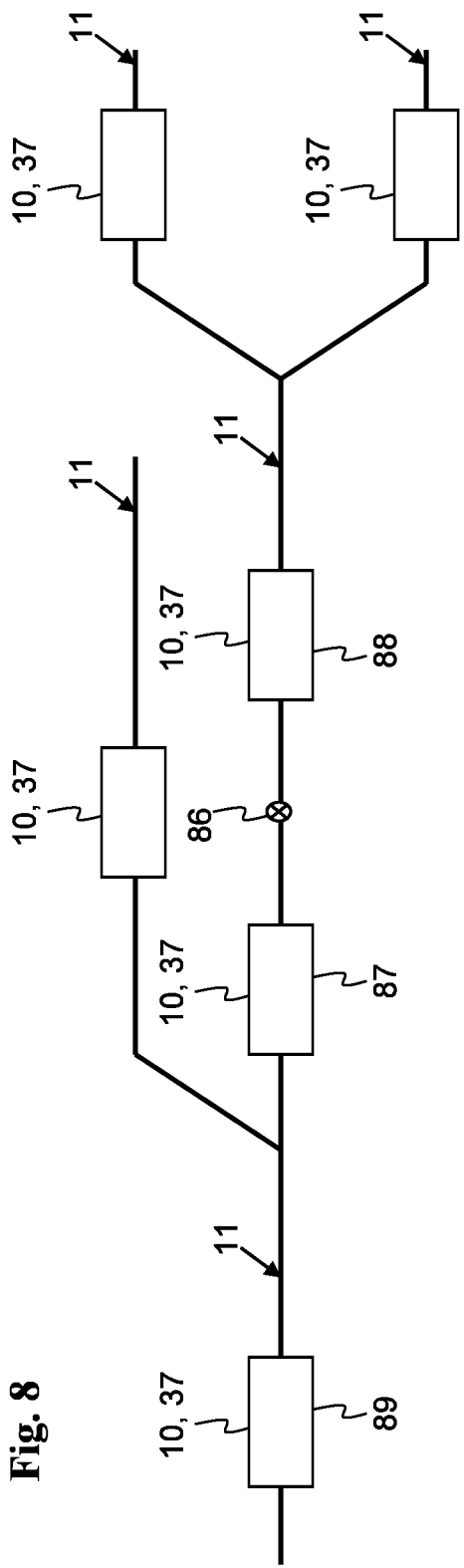

METHOD AND SYSTEM FOR DYNAMIC FAULT DETECTION IN AN ELECTRIC GRID

CROSS-REFERENCE TO RELATED APPLICATIONS

This application is a U.S. National Phase Application under 35 U.S.C. 371 of International Application No. PCT/IB2017/053298, which has an international filing date of Jun. 4, 2017, and which claims the benefit of U.S. Provisional Application No. 62/349,161, filed Jun. 13, 2016, the disclosure of which is incorporated herein by reference in its entirety.

FIELD

The method and apparatus disclosed herein are related to the field of electric grid, and, more particularly but not exclusively, to electric transmission and distribution networks and, more particularly but not exclusively, to detecting faults in an electric grid.

BACKGROUND

The electric grid may have many faults. Various components of the grid may fail, and a failure may be instantaneous, gradual, or intermittent. Some faults may be caused by the environment, such as humidity, smoke, dust, wind, trees, etc. Various faults and failures may have different characteristics and affect the network in different ways. Characterizing, detecting, identifying and localizing faults in an electric grid is a known problem. It would therefore be highly advantageous to have devoid of the above limitations.

SUMMARY

According to one exemplary embodiment there is provided a system, a method, and/or a computer program for detecting a fault in an electric grid, the system including a plurality of grid measuring devices distributed in the electric grid, where a grid measuring device includes a current measurement sensor and/or a voltage measurement sensor, the grid measuring devices being operative to measure at least one of current measurement and voltage measurement to form a plurality of measurements with their respective time of occurrence, the method, device, and a computer program enabling a user to define at least one fault type, and at least one rule for detecting the at least one fault type, the rule associating the fault type with at least one of the measurements, executing the measurements, and analyzing the measurements according to the at least one rule to detect a fault.

According to another exemplary embodiment the measurement includes at least one of: an absolute value, a change of value, and a rate of change of value, an instantaneous change of at least one of voltage, current, and power, a transient, a spike, and a surge.

According to yet another exemplary embodiment the rule includes at least one of: a plurality of measurements by a single grid measurement device, the measurements executed in substantially the same time, a plurality of measurements by a single grid measurement device, the measurements executed in different times, and a plurality of measurements by a plurality of grid measurement devices, the measurements executed substantially during the same time.

According to still another exemplary embodiment the system additionally measures at least one of: cable temperature, wind speed, humidity, cable motion, cable height, cable depression, and cable angle, Further according to another exemplary embodiment analyzing the measurements according to a rule to detect a fault includes correlating a current measurement and/or a voltage measurement with a measurements of any of cable temperature, wind speed, humidity, cable motion, cable height, cable depression, cable angle, and time-of-day.

Still further according to another exemplary embodiment the fault is at least one of: a cable of the grid being contacted by an object, corrosion developing in the cable, corrosion developing in a clamp, a damaged insulator of the cable, developing current leakage associated with the cable, a bad connection, a hot-spot, and a frayed cable.

Yet further according to another exemplary embodiment the rule additionally includes measuring a difference between measurements of at least two grid measuring devices, detecting a time-dependent change of the difference, and associating a fault with the time dependent change.

Even further according to another exemplary embodiment the time-dependent change is at least one of monotonous, cyclic, and repetitive.

Additionally, according to another exemplary embodiment a rule determines a fault when two or more grid measuring devices detected the time-dependent change, each, and where these two or more grid measuring devices detected time-dependent change of different value.

According to still another exemplary embodiment the time-dependent change is repetitive and the fault is a cable of the grid being contacted by an object.

According to yet another exemplary embodiment the time-dependent change is monotonous and the fault is a developing current leakage.

Further according to another exemplary embodiment the time-dependent change is cyclic and correlated with at least one of time-of-day, and temperature, and the fault is at least one of developing corrosion and damaged insulator.

Still further according to another exemplary embodiment a rule can be defined to execute, collect, and communicate measurements, where the rule and/or the measurements are associated with a predefined fault.

Yet further according to another exemplary embodiment the system communicates at least one of the measurement, a result of the analysis of the measurements according to the rule, and the fault.

Even further according to another exemplary embodiment the system may request a first grid measuring device to execute at least one of: execute at least one measurement, store the at least one measurement, analyze the at least one measurement to form analysis result, and communicate at least one of: the at least one measurement, and the analysis result, where the request results from analysis of at least one measurement executed by a second grid measuring device.

Additionally, according to another exemplary embodiment the request includes time of measurement and the time of measurement is associated with time of at least one measurement executed by the second grid measuring device.

According to yet another exemplary embodiment the requested measurement is associated with a period of time around the time of at least one measurement executed by the second grid measuring device.

According to still another exemplary embodiment the predetermined period is not larger than time of travel of the transient between the measuring device detecting the transient and the proximal measuring device, according to speed of electric signal in a cable of the grid.

Further according to another exemplary embodiment the communicating at least one of the measurement includes a plurality of low-resolution measurements, and the request includes request for a plurality of high-resolution measurements.

Still further according to another exemplary embodiment the resolution includes time-resolution and/or repetition rate of the plurality of measurements.

Yet further according to another exemplary embodiment the system may detect a plurality of transients by a first measuring device and a corresponding time of measurement of the transients, and report the transients upon a second measuring device placed downstream of the first measuring device did not detect a transient within a predetermined period around the time of measurement of the transients detected by the first measuring device, and/or a second measuring device placed downstream of the first measuring device detected repeated opposite transients within a predetermined period around the time of measurement of the transients detected by the first measuring device.

Even further according to another exemplary embodiment the predetermined period is not larger than time of travel of the transient between the first measuring device and the second measuring device according to speed of electric signal in a cable of the grid.

Additionally, according to another exemplary embodiment method the system may detect a repeated change of value between successive measurements executed by a first measuring device within a time period, and accordingly a rule may determine a fault where the repeated change of value is substantially different from change of value between successive measurements within the time period of at least one second measuring device proximal to the first measuring device.

Unless otherwise defined, all technical and scientific terms used herein have the same meaning as commonly understood by one of ordinary skill in the relevant art. The materials, methods, and examples provided herein are illustrative only and not intended to be limiting. Except to the extent necessary or inherent in the processes themselves, no particular order to steps or stages of methods and processes described in this disclosure, including the figures, is intended or implied. In many cases the order of process steps may vary without changing the purpose or effect of the methods described.

BRIEF DESCRIPTION OF THE DRAWINGS

Various embodiments are described herein, by way of example only, with reference to the accompanying drawings. With specific reference now to the drawings in detail, it is stressed that the particulars shown are by way of example and for purposes of illustrative discussion of the preferred embodiments only, and are presented in order to provide what is believed to be the most useful and readily understood description of the principles and conceptual aspects of the embodiment. In this regard, no attempt is made to show structural details of the embodiments in more detail than is necessary for a fundamental understanding of the subject matter, the description taken with the drawings making apparent to those skilled in the art how the several forms and structures may be embodied in practice.

In the drawings:

FIG. 6 is a flow-chart of measurements analysis;

FIG. 7 is a flow-chart of a measurement scan procedure; and

FIG. 8 is a schematic diagram of a part of a grid having a fault, where the location of the fault is determined by two or more grid measuring devices.

DETAILED DESCRIPTION

Figure 1:
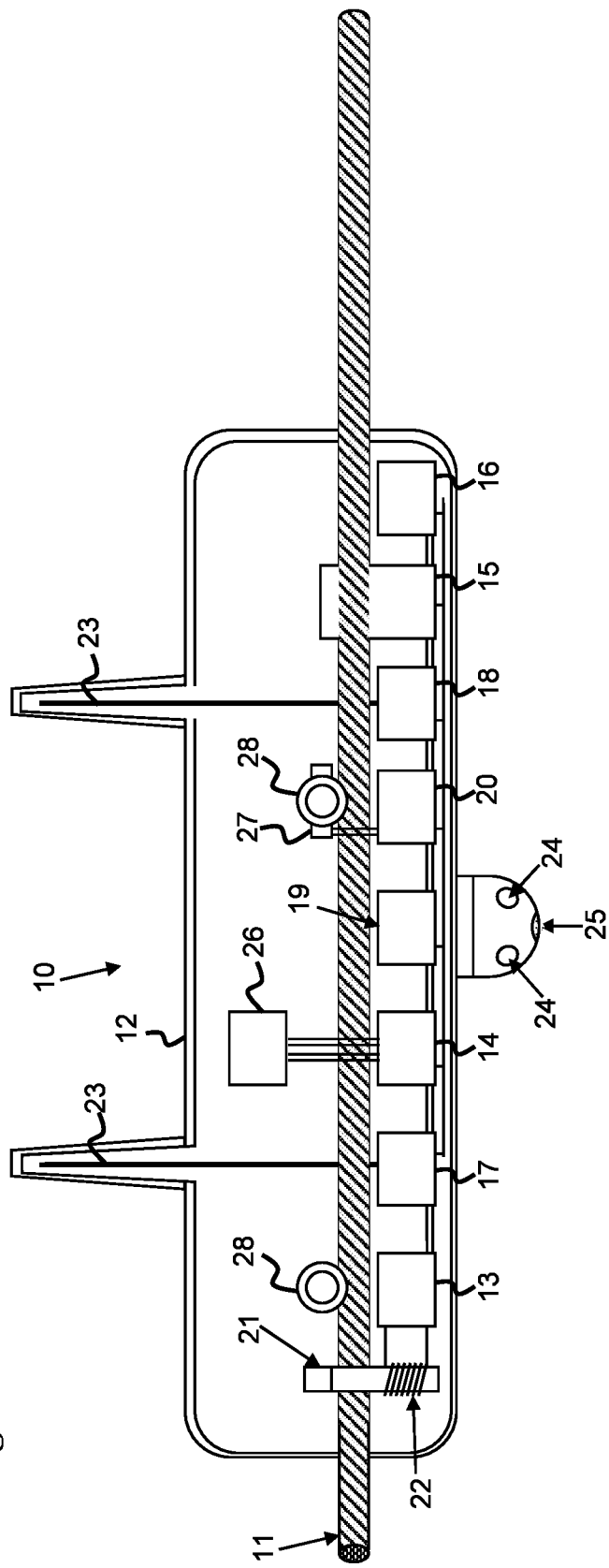
FIG. 1 is a simplified illustration of a grid measuring device mounted on an electric cable.

The present embodiments comprise a method and a system for detecting faults in an electric network, and, more particularly but not exclusively, detecting dynamic faults. The principles and operation of a device and method for detecting dynamic faults according to the several exemplary embodiments may be better understood with reference to the following drawings and accompanying description.

Before explaining at least one embodiment in detail, it is to be understood that the embodiments are not limited in its application to the details of construction and the arrangement of the components set forth in the following description or illustrated in the drawings. Other embodiments may be practiced or carried out in various ways. Also, it is to be understood that the phraseology and terminology employed herein is for the purpose of description and should not be regarded as limiting.

In this document, an element of a drawing that is not described within the scope of the drawing and is labeled with a numeral that has been described in a previous drawing has the same use and description as in the previous drawings. Similarly, an element that is identified in the text by a numeral that does not appear in the drawing described by the text, has the same use and description as in the previous drawings where it was described.

The drawings in this document may not be to any scale. Different Figs. may use different scales and different scales can be used even within the same drawing, for example different scales for different views of the same object or different scales for the two adjacent objects.

The purpose of the embodiments is to measure various electric parameter in a plurality of locations in an electric network and determine, by comparing a plurality of measurements, that a fault exists, the type or characteristic of the fault, and its location.

The term grid, or electric grid, may refer to the electric transmission network and/or the electric distribution network, and to any part of such network between the power generating station, or stations, and the load, or the consumer.

The term 'measurement' or 'electrical measurement' may refer to any type of measurement of any electric parameter such as voltage, current, electric field, magnetic field, resistance, capacitance, inductance, electric charge, etc.

The term 'physical measurement' or 'mechanical measurement' may refer to any type of measurement of any physical parameter other than electrical parameters. Such parameters may be temperature, wind, humidity, motion, height, (cable) depression, (cable) angle, etc.

Reference is now made to FIG. 1, which is a simplified illustration of a grid measuring device 10 mounted on an electric cable 11, according to one exemplary embodiment.

As shown in FIG. 1, the grid measuring device 10 may include a box, or a body, 12, through which the electric cable 11 passes. The electric cable 11 may be a part of an electric grid, an electric transmission network, or an electric distribution network, such as maintained by a power utility to provide electricity to the public, to industrial plants, etc. The grid measuring device 10 may therefore be mounted on a live cable 11. That is, when cable 11 is fully powered and/or carries electric voltage and/or electric current.

The box 12 is therefore constructed of two parts which may be opened, and then closed around the cable 11. Alternatively, box 12 may be constructed of one part surrounding most of the cable diameter and having an opening at one side to be able and attach the box over cable 11.

As shown in FIG. 1, the grid measuring device 10 may include a power supply module 13, a controller module 14, one or more electric measuring devices 15, one or more physical measuring devices 16, and a backhaul communication module 17. Optionally, the grid measuring device 10 may also include a local area communication module 18, a remote sensing module 19, and a propulsion control module 20.

As shown in FIG. 1, the grid measuring device 10 may include a magnetic core 21 over which at least one coil is wrapped to form a winding 22. The magnetic core 21 may be mounted around the electric cable 11. The magnetic core 21 may be constructed from two parts, a part in each of the two parts of box 12, where the two parts of the magnetic core 21 are closed around electric cable 11 when box 12 is closed around electric cable 11. FIG. 1 shows grid measuring device 10 open, with one part of the box 12 removed, but with magnetic core 21 closed around electric cable 11.

The magnetic core 21 typically derives magnetic field from the electric current flowing in the electric cable 11. Winding 22 typically derives electric current from the magnetic flux in the magnetic core 21. Winding 22 may be electrically coupled to power supply module 13, which, as shown in FIG. 1, typically provides electric voltage to other modules of grid measuring device 10. It is appreciated that grid measuring device 10 may derive electric power from a single electric cable 11.

Alternatively, for example when used with insulated high-voltage cables, and/or underground cables and/or low-voltage grids, power supply module 13 may be connected to sensors attached to electric cables deriving power supply from a main unit connected to a low voltage output of a transformer. Such configuration of grid measuring device 10 may have only one part with an opening at the bottom.

Backhaul communication module 17 and local area communication module 18 may be coupled, each and/or both, to one or more antennas 23. Remote sensing module 19 may be coupled to and control various sensors, one or more cameras 24, one or more microphones 25, etc. It is appreciated that a camera can be mounted on a system of axles providing three-dimensional rotation. Alternatively, a plurality, or an array, of fixed cameras can be mounted to cover a large field of view as needed.

Backhaul communication module 17 and local area communication module 18 may use any type of communication technology and/or communication network such as, but not limited to: The terms 'communication technology', or 'communication network', or simply 'network' refer to any type of communication medium, including but not limited to, a fixed (wire, cable) network, a wireless network, and/or a satellite network, a wide area network (WAN) fixed or wireless, including various types of cellular networks, a local area network (LAN) fixed or wireless including Wi-Fi, and a personal area network (PAN) fixes or wireless including Bluetooth, ZigBee, and NFC, power line carrier (PLC) communication technology, etc. The terms 'communication network', or 'network' may refer to any number of networks and any combination of networks and/or communication technologies.

Optionally, grid measuring device 10 may also include a global positioning service (GPS) module 26 and may use it to measure, monitor, and/or control the position of the grid measuring device 10 along electric cable 11. GPS module 26 may also provide an accurate universal clock, for example, for accurately determining absolute time of measurement.

Controller module 14 may include a processor unit, one or more memory units (e.g., random access memory (RAM), a non-volatile memory such as a Flash memory, etc.), one or more storage units (e.g. including a hard disk drive and/or a removable storage drive, etc.) as may be used to store and/or to execute a software program and associated data and to communicate with external devices.

Propulsion control module 20 may be coupled to one or more actuating devices such as electric motor 27, which may be coupled to one or more wheels 28. Wheels 28 may be mounted on cable 11 to enable propulsion control module 20 to move the grid measuring device 10 along cable 11 by controlling the electric motor 27.

It is appreciated that the propulsion system of grid measuring device 10 (including, but not limited to propulsion control module 20, one or more electric motors 27, one or more wheels 28, etc.) may be operative to move grid measuring device 10 along cable 11 and/or to rotate grid measuring device 10 around cable 11.

It is appreciated that electric motor 27 represents herein any type of technology adequate to maneuver grid measuring device 10 along and/or around cable 11, including, but not limited to, an AC motor, a DC motor, a stepper motor, a pneumatic pump and/or motor, a hydraulic pump and/or motor, or any other type of actuator.

Figure 2:
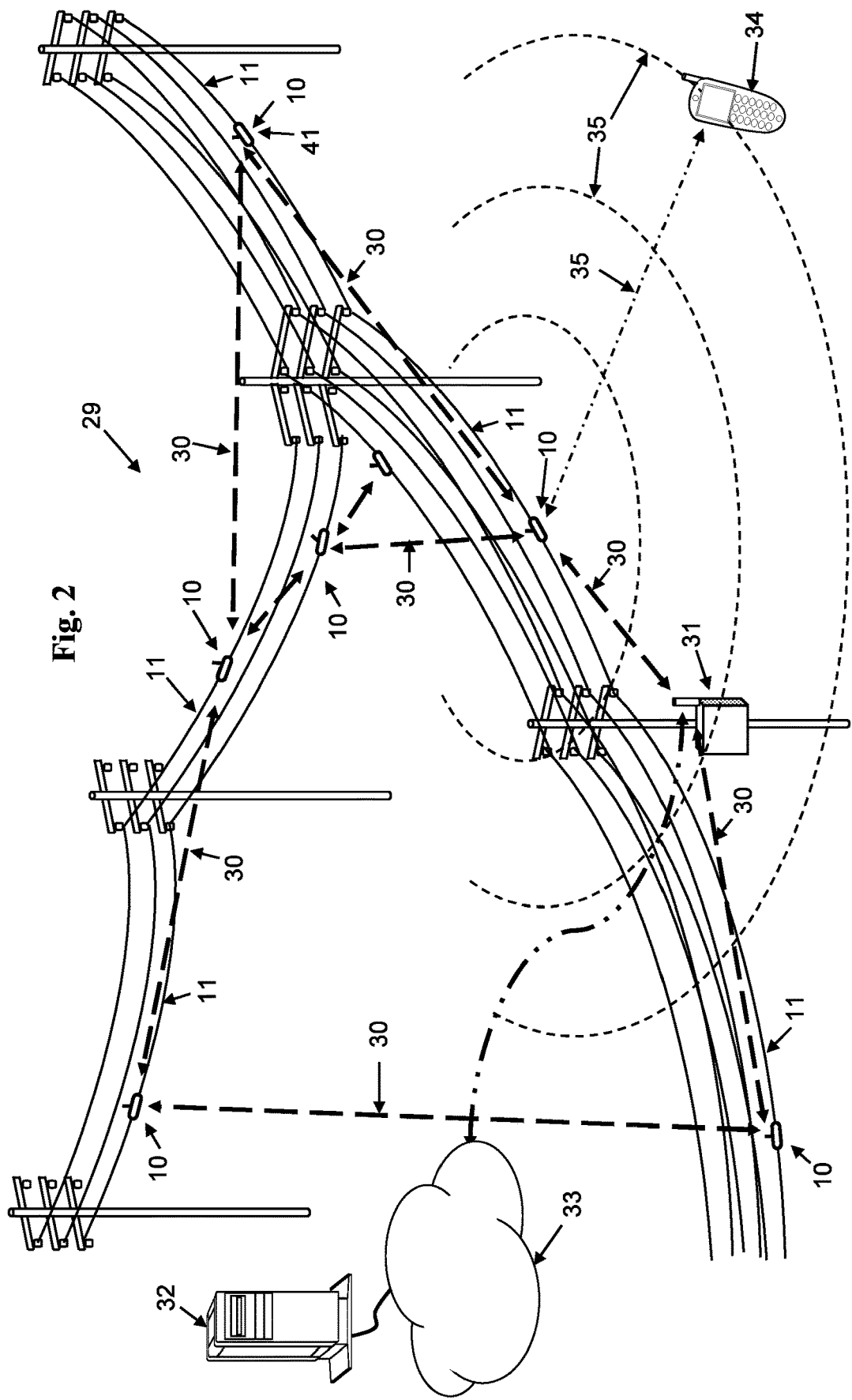
FIG. 2 is a simplified illustration of a plurality of grid measuring devices distributed over various cable segments of electric transmission or distribution network.

Reference is now made to FIG. 2, which is a simplified illustration of a plurality of grid measuring devices 10 distributed over various cable segments of electric transmission or distribution network 29, according to one exemplary embodiment. As an option, the illustration of FIG. 2 may be viewed in the context of the details of the previous Figures. Of course, however, the illustration of FIG. 2 may be viewed in the context of any desired environment. Further, the aforementioned definitions may equally apply to the description below.

As shown in FIG. 2, electric transmission or distribution network 29 may include a plurality of segments of electric cable 11 and grid measuring devices 10 may be mounted on any segment of electric cable 11, including successive segments (carrying the same electric phase) and parallel segments (carrying different electric phases).

As shown in FIG. 2, grid measuring devices 10 may communicate between themselves using, for example, backhaul communication module 17 shown and described with reference to FIG. 1. Grid measuring devices 10 may form, for example, a mesh network 30.

As shown in FIG. 2, grid measuring devices 10 may use their backhaul communication module 17 and/or mesh network 30 to communicate with an area controller 31. Area controller 31 may communicate with a central controller or server 32, for example, using a wide area wireless communication network (e.g. WAN), such as, for example, cellular network 33. It is appreciated that, as an option, grid measuring devices 10 may also communicate over WAN directly with the central controller or server 32.

As shown in FIG. 2, grid measuring devices 10 may also use their local area communication module 18 shown and described with reference to FIG. 1 to communicate with communication terminals 34 such as smartphone within the range of the local area network 35.

As grid measuring devices 10 move about their respective cable segments the mesh network 30 may change its topology. It is appreciated that such changes of the topology of the mesh network 30 may result in one or more of the grid measuring devices 10 being disconnected from the mesh network 30, and consequently from the area controller 31 and/or central controller 32. It also appreciated that when a first grid measuring device 10 is disconnected it may also disconnect other grid measuring devices 10 who depend on the first grid measuring device 10 for connectivity with the mesh network 30. It is also appreciated that a grid measuring device 10 may fail and disconnect a part of the mesh network 30 (e.g., one or more grid measuring devices 10) from the rest of the mesh network 30.

When a plurality of grid measuring devices 10 are mounted in a particular part of the electric transmission or distribution network 29 they arrange themselves in at least one particular topology (structure) of mesh network 30 in which all the grid measuring devices 10 are within the range of the mesh network 30. This particular topology or structure of mesh network 30 is recorded by the respective grid measuring devices 10 as a standard or default topology. The grid measuring devices 10 record their location in their respective segment of the electric cable 11, for example, by recording their respective GPS data in a non-volatile memory.

The process of organizing and recording one or more standard or default topologies or structures of the mesh network 30 and the respective positions of each of the grid measuring devices 10 may be executed under the control or supervision of the local area controller 31.

It is appreciated that several such standard or default topologies or structures of the mesh network 30 are created with the goal that no single failed grid measuring device 10 may disconnect a part of the mesh network 30. For example, if a particular grid measuring device 10 has failed there is a standard or default topologies or structures of the mesh network 30 in which all other grid measuring device 10 may communicate.

A grid measuring device 10, when disconnected from the network, may position itself automatically in its respective position in such standard or default topologies or structures of the mesh network 30. Particularly, when the grid measuring device 10 senses that it is disconnected from the mesh network 30 it automatically returns to the default location, for example as indicated by the GPS data recorded in the non-volatile memory as described above.

The plurality of standard or default topologies or structures may be ordered and a grid measuring device 10, when disconnected from the network, may scan the standard or default topologies or structures according to their order.

To resolve situation where one or more grid measuring device 10 are disconnected a part of the plurality of the grid measuring devices 10 may select a particular standard topology and the rest of the grid measuring devices 10 may scan the standard topologies until all the operative grid measuring devices 10 are in communication.

For example, the area controller 31 may select a standard topology according to the identification of the disconnected one or more grid measuring devices 10 and instruct the connected grid measuring devices 10 to assume this standard topology and wait for the disconnected one or more grid measuring devices 10 to connect. This process may repeat until all the disconnected one or more grid measuring devices 10 connect to the mesh network 30, or until one or more grid measuring devices 10 are determined faulty.

Alternatively, to reduce the risk of losing connectivity with a large part of the grid measuring devices 10, the area controller 31 may operate a single grid measuring device 10 at a time. The area controller 31 may instruct all the other grid measuring devices 10 to position themselves in their default locations, or in a particular standard topology selected to enable the operative grid measuring device 10 to travel along its cable segment, for example, without interruption to is connectivity to the mesh network 30.

It is appreciated that when a grid measuring devices 10 perform an action such as 'position itself', 'returns' (to default location), 'travel along its cable segment', 'change topology', 'assume topology', 'scan topologies', etc., the action refers to the grid measuring devices 10 using its propulsion control module 20, electric motor 27, wheels 28, etc. to maneuver itself along cable 11.

Figure 3:
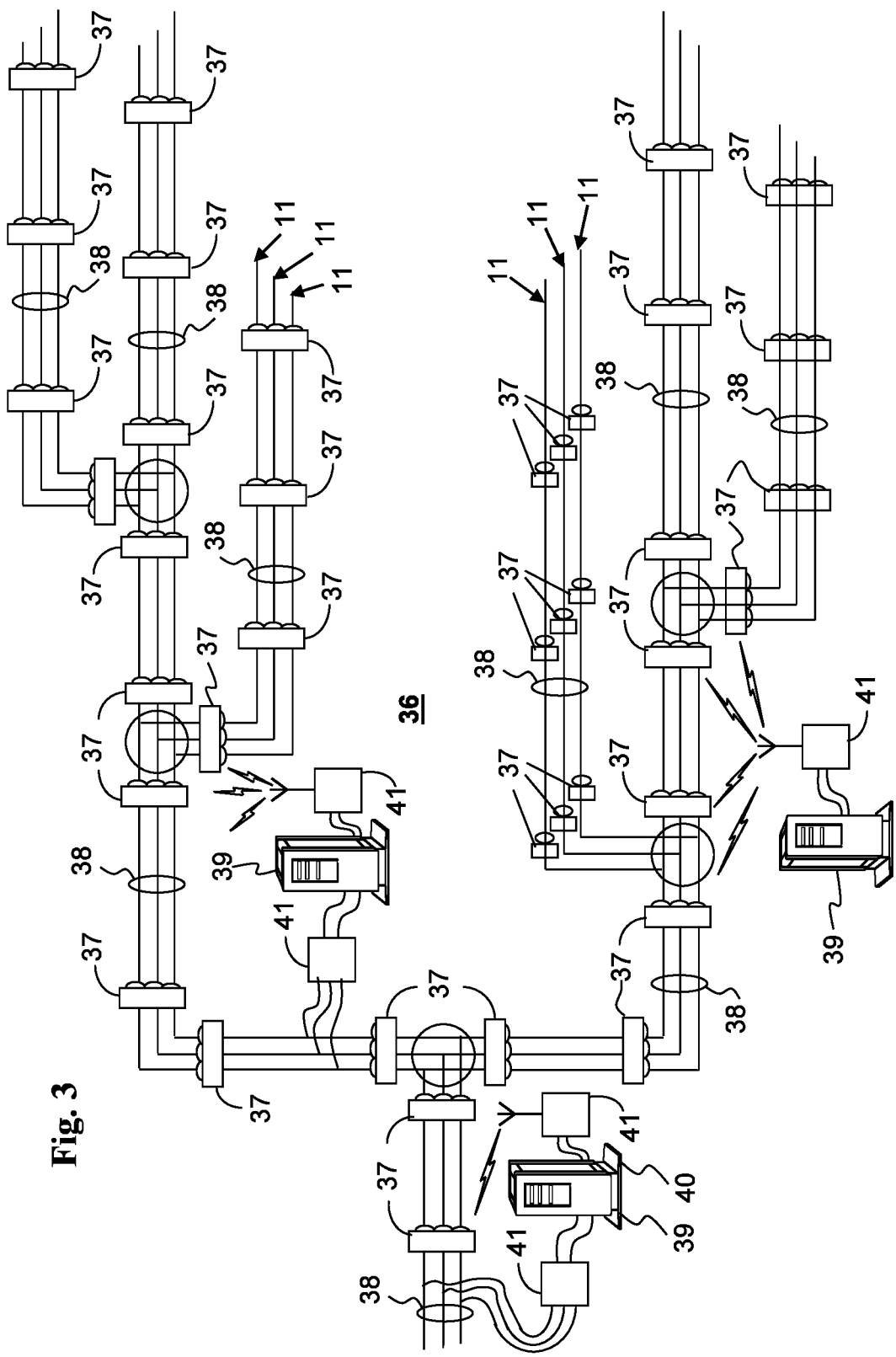
FIG. 3 is a simplified schematic diagram of a grid measuring system.

Reference is now made to FIG. 3, which is a simplified schematic diagram of a grid measuring system 36 according to one embodiment.

As shown in FIG. 3, the grid measuring system 36 may include a plurality of grid measuring devices 37 distributed over an electric transmission network 38. The grid measuring system 36 may also include at least one area controller 39. One of the area controllers 39 is a master central controller 40, for example, positioned upstream.

Some of grid measuring devices 37 are single-phase devices such as grid measuring device 10 of FIG. 1, and may be connected to a single cable 11, while other grid measuring devices 37 are three-phase devices. A three-phase devices differ from a single-phase device by having at least one electric measuring device for each phase and is therefore connected to three cables 11.

The area controllers 39 may communicate with the grid measuring devices 37 using any suitable communication technology. Each of the area controllers 39 may control a different segment of the electric transmission network 38. Optionally, the segments controlled by the different area controllers 39 at least partially overlap to provide redundancy so that the grid measuring system 36 is resilient to a fault of one or more area controllers 39.

It is appreciated that area controllers 39 can be connected to a cable-based communication network, may an Internet Protocol (IP) based communication network. It is appreciated that one or more of the plurality of area controllers 39 is used as a master central controller for controlling the other area controllers 39.

Whether using wired communication technology, wireless communication technology, PLC communication technology, or any other communication technology, the grid measuring system 36 can use short range communication technology or long range communication technology. Using long range communication technology (wired, wireless, PLC, etc.) the grid measuring devices 37 may communicate directly with their area controller 39.

Alternatively, using short range communication technology (wired, wireless, PLC, etc.), the grid measuring devices 37 may communicate with their neighboring grid measuring devices 37, which relay the communication upstream until it reaches the master central controller 40, and vice versa. FIG. 3 shows area controllers 39 communicating with grid measuring devices 37 using communication units 41, Communication units 41 may use any type of communication technology including wired, wireless and/or PLC technologies, and particularly, cellular, Wi-Fi, Bluetooth, ZigBee, etc.).

For example, grid measuring devices 37 may use PLC or RF communication technology such as Wi-Fi, Bluetooth, and/or ZigBee to communicate with area controllers 39, while area controllers 39 may use wired, WiMAX, and/or cellular technology to communicate with master central controller 40. Each of these devices may include two different communication technologies to provide redundancy and backup.

The grid measuring devices 37 may communicate directly, or indirectly, via area controllers 39, with the master central controller 40. May, the area controllers 39 communicate with the master central controller 40.

It is appreciated that the electric transmission network 38 is a three-phase transmission network, however, other configurations are also possible.

Figure 4:
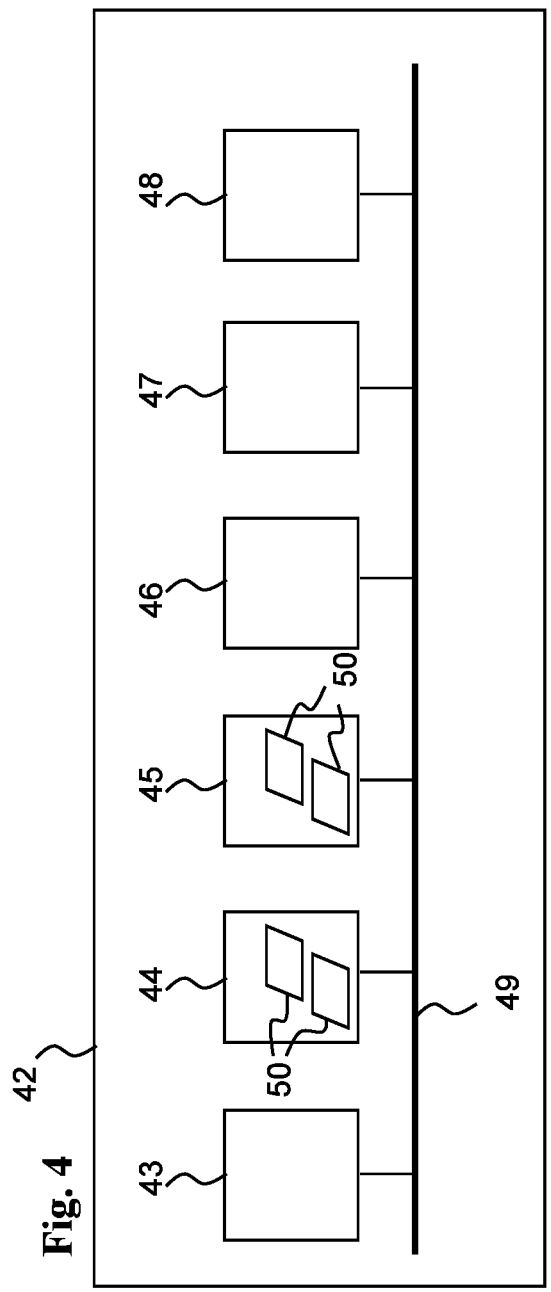
FIG. 4 is a simplified block diagram of a computing device or a computing system used within the grid measuring system.

Reference is now made to FIG. 4, which is a simplified block diagram of a computing device or a computing system 42, according to one exemplary embodiment. As an option, the block diagram of FIG. 4 may be viewed in the context of the details of the previous Figures. Of course, however, the block diagram of FIG. 4 may be viewed in the context of any desired environment. Further, the aforementioned definitions may equally apply to the description below.

Computing system 42 is a block diagram of a computing device used for area controller 31 and/or central controller 32 of FIG. 2, as well as area controllers 39 and/or central controller 40. Computing system 42 may execute any software programs such as for analyzing measurements taken by any one or more grid measuring device 10 of FIG. 2, and/or grid measuring devices 37 of FIG. 3.

As shown in FIG. 4, computing system 42 may include at least one processor unit 43, one or more memory units 44 (e.g., random access memory (RAM), a non-volatile memory such as a Flash memory, etc.), one or more storage units 45 (e.g. including a hard disk drive and/or a removable storage drive, representing a floppy disk drive, a magnetic tape drive, a compact disk drive, a flash memory device, etc.).

Computing system 42 may also include one or more communication units 46, one or more graphic processors 47 and displays 48, and one or more communication buses 49 connecting the above units.

Computing system 42 may also include one or more computer programs 50, or computer control logic algorithms, which may be stored in any of the memory units 44 and/or storage units 45. Such computer programs, when executed, enable computing system 42 to perform various functions as set forth herein. Memory units 44 and/or storage units 45 and/or any other storage are possible examples of tangible computer-readable media. Particularly, computer programs 50 may include a software program for analyzing one or more measurements received from one or more grid measuring device 10 of FIG. 2, and/or grid measuring devices 37 of FIG. 3.

Figure 5:
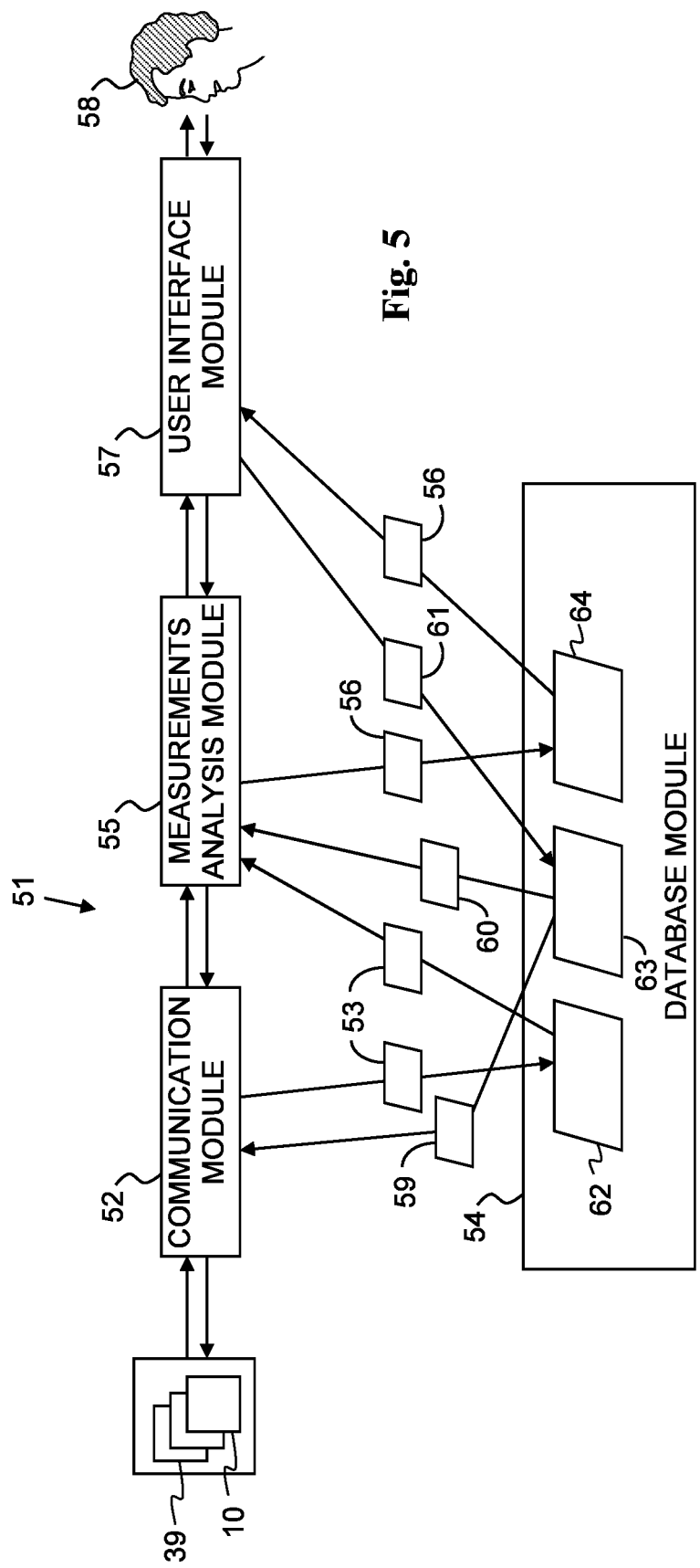
FIG. 5 is a block diagram of a dynamic fault detection software program used by the grid measuring system.

Reference is now made to FIG. 5, which is a block diagram of a dynamic fault detection software program 51, according to one exemplary embodiment.

As an option, the block diagram of dynamic fault detection software program 51 of FIG. 5 may be viewed in the context of the details of the previous Figures. Of course, however, dynamic fault detection software program 51 of FIG. 5 may be viewed in the context of any desired environment. Further, the aforementioned definitions may equally apply to the description below.

Dynamic fault detection software program 51 may be executed by a computing system 42, and/or by an area controller 31 or 39, and/or by central controller or server 32 or 40, as well as by a grid measuring devices 10 or 37.

As shown in FIG. 5, dynamic fault detection software program 51 may have the following modules:

A communication module 52, which may communicate with one or more grid measuring device 10 of FIG. 2, and/or grid measuring devices 37 of FIG. 3. Communication module 52 may receive various measurements from one or more grid measuring devices and/or instruct any such one or more grid measuring devices to take one or more particular measurements in a particular manner. Communication module 52 may store such measurements 53 in database module 54.

It is appreciated that the use of a database such as database module 54 is an example of a possible embodiments and other embodiments for logging and storing data are contemplated, including any type of memory or storage, including temporary memory (RAM).

Measurements analysis module 55 may load measurements 53 from database module 54, produce analysis results 56, and store the analysis results in database module 54.

User interface module 57 may enable a user 58 to manage the dynamic fault detection software program 51, for example, by determining one or more operational parameters of dynamic fault detection software program 51. User interface module 57 may enable a user 58 to access analysis results 56. User interface module 57 may also automatically alert user 58 upon a particular event, as determined by user 58. User interface module 57 may enable a user 58 to determine operational parameters such as measurement collection rules 59, measurements analysis rules 60, and event alarm rules 61.

Database module 54 may include measurement database 62 including measurements collected by communication module 52. Operational database 63, including collection rules 59, analysis rules 60, event alarm rules 61, and scan schedules. And analysis results database 64.

It is appreciated that the use of stored rules such as rules 59, 60, and rules 61 is an example of a possible embodiments and other embodiments are contemplated. For example the logic of such rules can be embedded in the code of the respective module.

Dynamic fault detection software program 51 may analyze measurements in various ways. For example, dynamic fault detection software program 51 may compare two or more measurements taken by the same grid measuring device in different time. For example, dynamic fault detection software program 51 may compare two or more measurements taken by the different grid measuring devices in substantially the same time. For example, dynamic fault detection software program 51 may compare two or more measurement changes detected by the same or by different grid measuring devices. For example, dynamic fault detection software program 51 may compare two or more measurements of transients detected by the same or by different grid measuring devices.

The term 'transient' may refer to any type of short-time or instantaneous change of voltage and/or current and/or power, such as a spike, a surge, etc.

Measurements analysis module 55 scans the measurement database 62 according to the measurements analysis rules 60 to detect abnormalities, or faults. Different faults may have different characteristics in the form of typical measurements, or relations between measurements, taken by the same and/or different grid measuring devices.

A measurements analysis rule 60 may be designed to detect and/or identify a particular fault. A measurements analysis rule 60 may also trigger the use of one or more particular measurement collection rules 59. For example, to collect higher accuracy measurements, for example, a set of measurements taken by a particular grid measuring device around a particular time.

Reference is now made to FIG. 6, which is a flow-chart of measurements analysis module 55, according to one exemplary embodiment.

As an option, the flow-chart of measurements analysis module 55 of FIG. 6 may be viewed in the context of the details of the previous Figures. Of course, however, flow-chart of measurements analysis module 55 of FIG. 6 may be viewed in the context of any desired environment. Further, the aforementioned definitions may equally apply to the description below.

As shown in FIG. 6, measurements analysis module 55 may start with step 65, for example by loading rules from operational database 63. Measurements analysis module 55 may then proceed to step 66 to scan measurements in measurement database 62. Measurements analysis module 55 may then proceed to step 67 to compare each measurement with all abnormality identification rules.

An abnormality identification rule may associate a measurement with a particular type of abnormality. Typically, the abnormality type associates the measurement with one or more possible faults. If (step 68) a measurement is identified as abnormal relevant measurements of neighboring grid measurement devices should be examined to determine if the fault exists and the type of fault.

If an abnormal measurement is detected (step 68), measurements analysis module 55 may then proceed to step 69 to load from operational database 63 one or more analysis rules associated with one or more abnormality types as determined in step 67. An analysis rule may indicate, for example, which other measurements should be analyzed and how. An analysis rule may require one or more previous measurements of the same grid measuring device, and/or one or more previous measurements of another grid measuring device. Measurements analysis module 55 may then proceed to step 70 to scan and compare measurement according to the analysis rule.

If measurements analysis module 55, using an analysis rule, identifies a fault (step 71) measurements analysis module 55 may report the fault (step 72), typically by entering a fault record into analysis results database 64 according the event alarm rule associated with the identified fault.

Measurements analysis module 55 may repeat steps 69 through 72 for all the rules associated with the identified abnormality (step 73). Measurements analysis module 55 may repeat steps 66 through 72 for all the measurements in the measurement database 62.

Measurements analysis module 55 may scan the measurement database 62 continuously, and/or repeatedly according to a particular schedule, and/or following an alert from a grid measuring device, and/or following an alert from a grid measuring device, and/or following an alert from communication module 52, and/or following an manual request by, for example, user 52. A scan schedule may be determined by user 52 or by an analysis rule.

Reference is now made to FIG. 7, which is a flow-chart of a measurement scan procedure 74, according to one exemplary embodiment. Measurement scan procedure 74 may be a possible implementation of step 70 of FIG. 6.

As an option, the flow-chart of a measurement scan procedure 74 of FIG. 7 may be viewed in the context of the details of the previous Figures. Of course, however, flow-chart of a measurement scan procedure 74 of FIG. 7 may be viewed in the context of any desired environment. Further, the aforementioned definitions may equally apply to the description below.

Measurement scan procedure 74 may be executed by a computing system 42, by central controller or server 32 or 40, and/or by an area controller 31 or 39, as well as by a grid measuring devices 10 or 37. Measurement scan procedure 74 is typically executed as a part of dynamic fault detection software program 51, and by the same device (e.g.).

However, dynamic fault detection software program 51 and measurement scan procedure 74 may be executed by different devices. For example, dynamic fault detection software program 51 may be executed by a central controller or server 32 or 40, with measurement scan procedure 74 executed by one or more area controllers 31 or 39. For example, dynamic fault detection software program 51 may be executed by an area controller 31 or 39, with measurement scan procedure 74 executed by one or more grid measuring devices 10 or 37.

As shown in FIG. 7, measurement scan procedure 74 may start with step 75 by determining the grid measuring devices for which measurements should be evaluated. Typically, such grid measuring devices may be located proximally downstream, e.g., in the direction of the power load(s) and/or power consumer(s). Alternatively or additionally, such grid measuring devices may be located proximally upstream, e.g., in the direction of the power generating stations(s).

Alternatively or additionally, such grid measuring devices may be located proximally in parallel, e.g., on a parallel power carrying conductor of the same phase, or on a power carrying conductor carrying a different phase, or a neutral line, etc. Alternatively or additionally, if the grid branches (upstream or downstream), such grid measuring devices may be located in parallel branches. The grid measuring devices for which measurements should be evaluated may be determined according to the abnormality type detected in step 67 of FIG. 6 and/or according to the analysis rule loaded in step 69 of FIG. 6. The grid measuring devices for which measurements should be evaluated may be determined according to the type and/or characteristics of the evaluated measurements of the neighboring devices. Thus, the evaluation may span any number of grid measuring devices.

It is appreciated that dynamic fault detection software program 51 may detect the direction of power flow and/or generator side(s). For example, assuming a power line carrying power from a main power generator in a power station connected to a first side of the line, and, on the same line, a photovoltaic power generation unit connected to the second side. A grid measuring device 10 may separately measure power flow for the two power supplies. Measurement scan procedure 74 may proceed to step 76 to determine if an adequate measurement exists for the one or more grid measuring devices selected in step 75. Such a measurements may be adequate if the measurement is of the required type, and/or was taken in a particular time, and/or has the adequate accuracy, etc.

A measurement may have different types such as voltage, current, phase between voltage and current, frequency, temperature, wind, etc., instantaneous measurement, average over any particular time period, etc., absolute value, change, gradient, etc.

If such adequate measurement does not exist, for example, in the measurement database 62, measurement scan procedure 74 may proceed to request the adequate measurement from the appropriate grid measuring device (as determined in step 75).

Measurement scan procedure 74 may typically proceed to step 77 to load a measurement collection rule 59 from operational database 63. Measurement scan procedure 74 may then proceed to step 78 to request the particular measurement from the grid measuring device as determined in step 75.

For example, step 78 may be implemented by measurement scan procedure 74 sending the appropriate measurement collection rule 59, via dynamic fault detection software program 51, and via communication module 52, to the appropriate area controllers (31, 39) and/or grid measuring devices (10, 37).

Measurement scan procedure 74 may then proceed to step 79 to reschedule the scan when the adequate measurement is available. Measurement scan procedure 74 may then proceed to step 80 to determine that (considering the lack of adequate measurement, and the scan rescheduling) a fault is not identified.

Dynamic fault detection software program 51 as well as measurement scan procedure 74 may be executed by and/or by a master central controller 40 and/or by an area controllers 39 and/or, both of FIG. 3, and/or by central controller or server 32 and/or area controller 31, both of FIG. 2. Steps 77 to 80 are typically executed by these entities. However, alternatively or additionally, dynamic fault detection software program 51 as well as measurement scan procedure 74 may be executed, in whole or in part, by any of the grid measuring devices 10 of FIGS. 1 and 2 and/or grid measuring devices 37 of FIG. 3.

The advantage of executing dynamic fault detection software program 51 as well as measurement scan procedure 74 by master central controller 40 and/or central controller or server 32 is the availability of a comprehensive measurement database 62 covering the entire grid, or a large part of the grid, and a long time period of measurement collection.

The advantage of executing dynamic fault detection software program 51 as well as measurement scan procedure 74 by the area controllers (31, 39) is that measurements are scanned in parallel and therefore faults and/or suspicious situations may be detected faster, at least for a limited area managed by a particular area controller.

The advantage of executing dynamic fault detection software program 51 as well as measurement scan procedure 74 by the grid measuring devices (10, 37) is that at least some faults and/or suspicious situations may be detected even faster, at least for the immediate proximity of a particular grid measuring device.

Each grid measuring device may store internally measurements that are not communicated to the area controllers (31, 39) and/or master central controller 40 and/or central controller or server 32. Similarly, an area controllers (31, 39) may store internally measurements that are not communicated to the master central controller 40 and/or central controller or server 32.

Therefore, if steps 76 to 78 are executed by an area controller (31, 39), the area controller may send the request to the appropriate grid measuring device (10, 37) within its territory, or to a neighboring area controller (31, 39) supervising the grid measuring device. Similarly, if steps 76 to 78 are executed by a grid measuring device (10, 37), it may send the request directly to the adequate neighboring grid measuring device. In such case the request may be provided substantially immediately and measurement scan procedure 74 may proceed directly to step 81.

In step 81 measurement scan procedure 74 may load the required measurement(s) of the neighboring grid measuring device(s), for example, according to the relevant analysis rule 60. If all the required measurements are available (step 82) measurement scan procedure 74 may proceed to step 83 to determine if a fault exists as well as the type of the fault (steps 84 and 85).

Therefore, for example, a first grid measuring device 10 or 37 may analyze the data it collects, typically in real-time, and determine that one or more additional measurements are required from a particular neighboring second grid measuring device 10 or 37. For example, the first grid measuring device may detect a change of a particular value in a particular time and request the second grid measuring device to send more detailed measurements that the second grid measuring device is storing internally for a predetermined period. After the first grid measuring device received the detailed measurements from the second grid measuring device it may determine a particular fault and inform the an area controller 31 or 39, which may start a broader scan for the fault. The same applies for a first area controller 31 or 39 interrogating a neighboring a second area controller 31 or 39.

This arrangement enables the grid measuring system 36 to monitor events such as transients instantaneously. Grid measuring system 36 may detect suspected faults in real-time and use very detailed measurements without having to communicate these detailed measurements to a central database. Instead, time-limited detailed measurements are stored by the grid measuring devices internally and may be requested and are used immediately by neighboring grid measuring devices.

It is appreciated that every unit of grid measuring system 36 may request any other unit to collect detailed measurements, and/or to send detailed measurements, to any other unit of grid measuring system 36. Particularly, a master central controller 40 may therefore request one or more area controllers 31 or 39 and/or grid measuring device 10 or 37 to send it detailed measurements. Similarly an area controller 31 or 39 may request one or more area controllers 31 or 39 and/or one or more grid measuring devices 10 or 37 to send it detailed measurements, or to send the detailed measurements to the master central controller 40. Similarly a measuring device 10 or 37 may request one or more area one or more grid measuring devices 10 or 37 to send it detailed measurements, or to send the detailed measurements to an area controller 31 or 39, or to the master central controller 40. Therefore, grid measuring system 36 may not need to communicate all the detailed measurements to the master central controller 40. Instead, detailed measurements are processed by the grid measuring device 10 or 37 collecting the measurements, and, if the grid measuring device 10 or 37 suspects a fault, a request is made to neighboring devices (e.g., one or more grid measuring devices 10 or 37, or area controllers 31 or 39) to communicate their detailed measurements (to a grid measuring device 10 or 37, an area controller 31 or 39, or to the master central controller 40) for detailed analysis. Therefore the network and the database are not loaded with unnecessary data.

It is appreciated that processing the analysis by each of the grid measuring devices 10 or 37 (e.g., step 70 of FIG. 6) enables processing the analysis in real-time, or near-realtime, and therefore the request for detailed measurements from one or more neighboring devices may be issued promptly (e.g., in real-time, or near-real-time) and therefore grid measuring devices 10 or 37 may need to store such detailed measurements internally for a relatively short period. Hence, the memory and/or storage requirements of the grid measuring devices 10 or 37 are lowered and/or more (types of) detailed measurements may be stored by the grid measuring devices 10 or 37.

It is appreciated that the term 'neighboring devices" may refer to devices (e.g., one or more grid measuring devices 10 or 37, or area controllers 31 or 39) on the same conductor (e.g., cable 11) phase-carrying, and/or on a parallel conductor such as a parallel phase-carrying conductor of a three-phase network. Similarly, the term 'neighboring devices" may also refer to one or more devices on a parallel branch of the network or grid.

Analysis rules 60 may have various forms according to the possible faults. Typically, a fault of a particular type may have one or more analysis rules 60 detecting the fault.

An analysis rule 60 may correlate, or compare, the same type of measurement of the same grid measuring device taken, for example, in different times, usually consecutive measurements. An analysis rule 60 may correlate, or compare, for example, the same type of measurement of different grid measuring devices taken in the same time. An analysis rule 60 may correlate, or compare, for example, measurements of different types of the same or different grid measuring devices. An analysis rule 60 may also include any combination of the above-mentioned correlations, or comparisons.

For example, wind may cause a tree or a similar object to touch the grid or otherwise cause a momentary surge, or a pulse, or a spike, or a change of current, or a change of voltage. Such surge, or change, may be detected by two or more grid monitoring devices. For example, the two grid monitoring devices upstream and downstream of the point where the tree touches the grid. However, the value of the measured parameter (e.g., current change or voltage spike) may be different, or even opposite.

Wind parameters may be measured directly or indirectly. For example, wind may be measured as the speed of air or as the effect of the wind on the cable. For example, the cable may be deflected, or swing, or oscillate, etc. Such cable deflection, sing and oscillation may be measured using, for example, an accelerometer, a gravimeter, or a similar device.

Such change of current, or voltage, is time-dependent and may be detected, for the same time (or roughly the same time) by two or more grid measuring devices. Such plurality of measuring devices may detect the same time-dependent change, where each grid measuring device may measure a time-dependent change of a different value. Thus, the difference between the measurements of the two grid measuring devices is also a time-dependent change, or pulse.

For example, an analysis rule 60 detecting a current increase in a first grid monitoring device and a current decrease in a proximal grid monitoring device may indicate a fault between the grid monitoring devices, the fault indicating a momentary short circuit due to an object touching the grid. For example, such fault indication (e.g., analysis rule 60) may also require a wind measurement of sufficient value, or humidity measurement of sufficient value, or a measurement air conductivity of sufficient value. The analysis rule 60 may further require that further grid monitoring devices upstream and/or downstream do not detect the relevant parameter (e.g., current decrease or increase), or detect a much lower value.

For example, an analysis rule 60 may detect a leakage between two grid monitoring devices, for example, by comparing current measurements of the two grid monitoring devices. If, for example, the current measurement of the upstream grid monitoring device is higher than the current measurement of the downstream grid monitoring device the difference may be accounted to some kind of leakage between the grid monitoring devices. The leakage value may be below a threshold value requiring reporting a fault (e.g., step 72).

However, based on consecutive measurements, analysis rule 60 may further detect that the leakage value is increasing with time. Such indication may require reporting the apparent fault (e.g., step 72) though the absolute leakage value may still be below the threshold. The analysis rule 60 may further indicate correlation with another parameter such as wind, temperature, humidity, and/or air conductivity.

Therefore, dynamic fault detection software program 51 may detect early enough the development of a leakage deterioration process of, for example, a transformer or an insulator.

Dynamic fault detection software program 51 may also detect cable discontinuity. Dynamic fault detection software program 51 a fault in a particular branch downstream of a particular grid measuring device and not appearing in the other branch.

Some sensors may be inaccurate, or drifting, or lose their calibration due to dust, humidity or ageing. Dynamic fault detection software program 51 may use an analysis rule 60 to overcome such situation by compensating for the different accuracy of two or more grid measuring device, or slow drifting, or de-calibration jump.

For example, an analysis rule 60 may detect a fault associated with corrosion in a connection between two elements of cable 11. For example, an analysis rule 60 may detect a difference between current measurements of two neighboring grid monitoring devices that may have been attributed to small leakage, but are correlated with, for example, temperature. For example, the current difference value is cyclic, increasing with the temperature during daytime and decreasing with temperature during the night. Step 72 mat therefore report a fault indicating possible corrosion in a cable connection between the two neighboring grid monitoring devices.

A grid measuring device may measure various parameters (e.g., electrical parameters, physical parameters, etc.) in high-resolution. For example, at a high rate (e.g., measurements per second), and/or high accuracy. According to one or more collection rules 59, a grid measuring device (10, 37) may then send to the grid measuring device upstream, and/or to the respective area controllers (31, 39), and/or to the central controller or server 32 and/or master central controller 40 selected low-resolution samples and/or averages of the respective measurements.

Each grid measuring device (10, 37) may store internally, for example, in the memory or storage of controller module 14 of FIG. 1, selected high resolution measurements. For example, grid measuring device (10, 37) may store internally a particular number of last measurements, or measurements for a particular recent time period, or measurements of any particular characterization.

For example, grid measuring device (10, 37) may store internally measurements associated with a particular irregularity such as a transient. Such associated measurements may be, for example, measurement of the same parameter just before and after the transient, or measurements of parameters of different types at the same time of the transient. Such measurements may not be transmitted upstream unless requested.

An analysis rule 60 may, for example, include a request for such high-resolution measurements from the grid measuring device reporting the transient, and/or from neighboring grid measuring devices.

An analysis rule 60 may then, for example, compare the detailed high-resolution measurements of two or more grid measuring devices to analyze, for example, the nature of a transient, and/or the location of a transient.

The location of a transient may be determined, for example, by comparing the exact time of measuring the transient by two or more grid measuring devices. For example, grid measuring devices located upstream and downstream of the location where the transient originated (alternatively, grid measuring devices located on the same side of the location where the transient originated). The exact time of measurement may be obtained via GPS module 26.

However, if the two grid measuring devices measure different shapes of the same transient it is important to compare the time measurements of the same feature of the transient. This may be achieved by comparing detailed high-resolution measurements. An analysis rule 60 may, for example, include a request for such high-resolution measurements from two or more grid measuring device. Such request may include high-resolution measurements of one or more types of parameters, such a voltage and current, for example, to assess instantaneous power.

GPS module 26 enables time measurements of about 10 nano-seconds, and thus enables estimating the location of a fault to about 3 meters. GPS module 26 also enables the synchronization of the measurements of a plurality of grid measuring devices.

Reference is now made to FIG. 8, which is a schematic diagram of a part of a grid having a fault, where the location of the fault is determined by two or more grid measuring devices, according to one exemplary embodiment.

As an option, the schematic diagram of FIG. 8 may be viewed in the context of the details of the previous Figures. Of course, however, the schematic diagram of FIG. 8 may be viewed in the context of any desired environment. Further, the aforementioned definitions may equally apply to the description below.

FIG. 8 shows grid measuring devices (10, 37) connected to a single-phase, phase-carrying conductor (e.g., cable 11). However, it is appreciated that the arrangement, system and method disclosed with reference to FIG. 8, may also apply to a three-phase network and/or multiple conductors.

The location of a fault may be determined according to the location of two or more grid measuring devices (10, 37) that are involved in measuring and/or detecting the fault. The location of a fault may be determined according to the accurate location of the grid measuring devices (10, 37), provided, for example, using accurate GPS measurements. The location of a fault relative to the grid measuring devices (10, 37), as, for example, described below, may be determined using accurately synchronized clocks in these grid measuring devices (10, 37), using GPS clock signals. If accurate (e.g., about 10 nanoseconds) clock synchronization is not available, the location of the fault may be roughly determined, for example, half-way between two grid measuring devices (10, 37).

Using hardware and/or software for high-accuracy fault location, the grid measuring system 36, or the dynamic fault detection software program 51, may first find a coarse location of the fault, for example between two grid measuring devices (10, 37). Then shall the grid measuring system 36, or the dynamic fault detection software program 51, may use one of the following test cases to determine accurate location of the fault, using highly accurate time of measurement associated with the fault as provided by the grid measuring devices (10, 37) nearest to the fault.

In a first test case shown in FIG. 8, the grid measuring system 36, or the dynamic fault detection software program 51, may locate a fault 86 between the two grid measuring devices (10, 37) such as the grid measuring devices designated by numerals 87 and 88, using the following formulas:

$$L1=L-L2 \qquad \text{Eq. 1:}$$

$$L2=(L-(T1-T2)*C)/2 \qquad \text{Eq. 2:}$$

Where:

C is the speed of the electric wave in a conductor, typically the speed of light, which is 300 meters per microsecond.

L is the distance between the two grid measuring devices 87 and 88.

L1 and L2 are the distances of the fault location from grid measuring device 87 and 88, respectively.

In a second test case one of the two grid measuring devices 87 and 88 does not provide time measurement of a relevant event or parameter. For example grid measuring device 88 measures normal current or voltage or no current or no voltage, etc. For example, associated with a fault such as wire cut or a short to ground, or there is no grid measuring device at that side of fault 86.

Grid measuring system 36, or the dynamic fault detection software program 51, may locate a fault 86 using, for example, grid measuring devices designated by numerals 87 and 89, using the following formulas:

$$L2=L+L1 \qquad \text{Eq. 3:}$$

$$L1=(L+(T1-T2)*C)/2 \qquad \text{Eq. 4:}$$

Where:

C is the speed of the electric wave in a conductor, typically the speed of light, which is 300 meters per microsecond.

L is the distance between the two grid measuring devices 87 and 88.

L1 and L2 are the distances of the fault location from grid measuring device 87 and 88, respectively.

The formulas above calculate the fault location along the cable. The fault location in absolute terms (such as GPS location) may be determined according to the actual travel of the cable above or below the ground. If, for example, there is no cable bend (e.g., due to a grid pole) the fault coordinates may be calculated according to the GPS coordinates of the grid measuring devices and calculating the cable path according to a straight line. If the cable bends the fault coordinates may be calculated using the actual wire segments and according to the actual wire route.

Grid measuring system 36 may therefore operate a plurality of measuring devices distributed over an electric grid where each of these measuring devices is capable of measuring at least current or voltage, and to record current measurement and/or voltage measurements with their respective time of occurrence.

The dynamic fault detection software program 51, may therefore detect a fault in the electric grid by first logging a plurality of such measurements, including transients, as detected by any of the plurality of measuring devices. The measurements, and/or transients, may include change of current value and/or change of voltage values. Typically such measurement is logged if such change is larger than a respective predetermined value.

The dynamic fault detection software program 51 may then detect a first transient detected by a first measuring device, and a second transient detected by a second measuring device, where the second transient occurring within a predetermined period after the first transient.

The dynamic fault detection software program 51 may then compute a source location for a transient according to the time of measurement of the transient by the two or more measuring devices.

The predetermined period may not be larger than the time of travel of such transient between the first measuring device and the second measuring device according, for example, to speed of electric signal in a cable of the grid.

The dynamic fault detection software program 51 may compute a source location by computing time difference between the time of occurrence of the respective transients, computing the travel distance of the transient during the time difference according to speed of electric signal in a cable of the grid, computing middle location between the first measuring device and the second measuring device, and determining the source location half the travel distance from the middle location closer to the measuring device having earlier time of occurrence of the respective transients.

The dynamic fault detection software program 51 may also detect a plurality of such transients detected by a first measuring device and a corresponding time of measurement of the transients, and report the transients if a second measuring device placed downstream of the source location did not detect a transient within a predetermined period around the time of measurement of the transients detected by the first measuring device. Alternatively, the dynamic fault detection software program 51 may report the transients if the second measuring device placed downstream detected repeated opposite transients within a predetermined period around the time of measurement of the transients detected by the first measuring device.

In this case also, the predetermined period may not be larger than the time of travel of the transient between the first measuring device and the second measuring device according to speed of electric signal in a cable of the grid.

The dynamic fault detection software program 51 may also compute the source location of a transient detected by the second measuring device by first computing the time difference between the time of occurrence of the respective transients detected by the first and the second measuring devices. Then by computing travel distance of the transient during the time difference according to speed of electric signal in a cable of the grid. Then by computing the location between the first measuring device and the second measuring device. And then by determining the source location as half the travel distance from the middle location closer to the measuring device having earlier time of occurrence of the respective transients.

The dynamic fault detection software program 51 may also measure and log temperature, with respective time of measurement, and thereafter detect a repeated change of value of measurement of a particular measuring device, where the repeated change of value of measurement is correlated with a respective temperature value or change of temperature of a cable of the electric grid.

The dynamic fault detection software program 51 may further detect a fault in an electric grid by detecting a transient by at least one measuring device and then requesting, from at least one proximal measuring device to report at least one measurement recorded within a predetermined period around the time of measurement of the transient. The predetermined period may not be larger than time of travel of the transient between the two measuring devices according to speed of electric signal in a cable of the grid.

It is appreciated that certain features, which are, for clarity, described in the context of separate embodiments, may also be provided in combination in a single embodiment. Conversely, various features, which are, for brevity, described in the context of a single embodiment, may also be provided separately or in any suitable sub-combination.

Although descriptions have been provided above in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art.

What is claimed is:

1. A computer-implemented method for detecting a fault in an electric grid, the method comprising the steps of:
    distributing in said electric grid a plurality of grid measuring devices comprising at least one of current measurement sensor and voltage measurement sensor, said grid measuring devices being operative to measure at least one of current measurement and voltage measurement to form a plurality of measurements with their respective time of occurrence;
    obtaining any of said measurements measured by a first measuring device of said grid measuring devices;
    requesting, by at least one of: said first measuring device, and a network server communicatively coupled to said plurality of grid measuring devices, a second grid measuring device to execute at least one of:
        execute at least one measurement,
        store said at least one requested measurement,
        analyze said at least one requested measurement to form requested analysis result, and
        communicate at least one of: said at least one requested measurement, and said requested analysis result,
    wherein said request results from analysis of at least one measurement executed by said first grid measuring device, wherein said analysis being performed by at least one of: one of said measuring devices, and said network server,
    wherein said request comprises time of measurement and said time of measurement is associated with time of at least one measurement executed by said first grid measuring device,
    wherein said fault is identified from a plurality of faults, wherein each fault of the plurality of faults is associated with at least one rule for detecting said at least one fault, said rule associating said fault with the measurement by the first measuring device and the requested measurement; and
    automatically alerting a user about a particular event associated with the identified fault.

2. The method according to claim 1 wherein said requested measurement is associated with a period of time around said time of at least one measurement executed by said first grid measuring device.

3. The method according to claim 2 wherein said period of time is not larger than time of travel of a transient between said first measuring device detecting said transient and said second measuring device, according to speed of electric signal in a cable of said grid.

4. The method according to claim 1 wherein said communicating at least one of said measurement comprises a plurality of low-resolution measurements, and
wherein said request comprises request for a plurality of high-resolution measurements.

5. The method according to claim 4 wherein said resolution comprises at least one of time-resolution and repetition rate of said plurality of measurements.

6. A computer-implemented method for detecting a fault in an electric grid, the method comprising the steps of:
distributing in said electric grid a plurality of grid measuring devices comprising at least one of current measurement sensor and voltage measurement sensor, said grid measuring devices being operative to measure at least one of current measurement and voltage measurement to form a plurality of measurements with their respective time of occurrence;
executing any of said measurements from at least a first measuring device of said grid measuring devices, and a second measuring device placed downstream of said first measuring device;
detecting a plurality of transients detected by a first measuring device and a corresponding time of measurement of said transients, the transient originating by the electric grid at least one of upstream and downstream of the first measuring device;
reporting said transients, by said first measuring device to at least one of: at least one of said plurality of grid measuring devices, and a network server communicatively coupled to said plurality of grid measuring devices, upon at least one of:
said second measuring device not having detected a transient within a predetermined period around said time of measurement of said transients detected by said first measuring device, and
said second measuring device detected repeated opposite transients within a predetermined period around said time of measurement of said transients detected by said first measuring device; and
automatically alerting a user about a particular event associated with the identified fault,
wherein said fault is identified from a plurality of faults, wherein each fault of the plurality of faults is associated with at least one rule for detecting said at least one fault, said rule associating said fault with the measurement by the first measuring device and the measurement by the second measuring device.

7. The method according to claim 6 wherein said predetermined period is not larger than time of travel of said transient between said first measuring device and said second measuring device according to speed of electric signal in a cable of said grid.

8. A computer program product embodied on a non-transitory computer readable medium, including instructions that, when executed by at least one processor, cause the processor to perform operations comprising:
obtaining any of said measurements measured by a first measuring device of said grid measuring devices;
requesting a second grid measuring device to execute at least one of:
execute at least one measurement,
store said at least one requested measurement,
analyze said at least one requested measurement to form requested analysis result, and
communicate at least one of: said at least one requested measurement, and said requested analysis result,
wherein said request results from analysis of at least one measurement executed by said first grid measuring device, and
wherein said request comprises time of measurement and said time of measurement is associated with time of at least one measurement executed by said first grid measuring device.

9. The computer program product according to claim 8, wherein said requested measurement is associated with a period of time around said time of at least one measurement executed by said second grid measuring device.

10. The computer program product according to claim 9, wherein said period of time is not larger than time of travel of said transient between said measuring device detecting said transient and said proximal measuring device, according to speed of electric signal in a cable of said grid.

11. The computer program product according to claim 8, wherein said communicating at least one of said measurement comprises a plurality of low-resolution measurements; and wherein said request comprises request for a plurality of high-resolution measurements.

12. The computer program product according to claim 11, wherein said resolution comprises at least one of time-resolution and repetition rate of said plurality of measurements.

13. A system for detecting a fault in an electric grid, the system comprising:
a plurality of grid measuring devices distributed in said electric grid, said grid measuring devices comprising at least one of current measurement sensor and voltage measurement sensor, said grid measuring devices being operative to
measure at least one of current measurement and voltage measurement to form a plurality of measurements with their respective time of occurrence,
analyze at least one measurement executed by a first grid measuring device, and
communicate to a second grid measuring device a request to execute at least one of:
execute at least one measurement,
store said at least one requested measurement,
analyze said at least one measurement to form requested analysis result, and
communicate to said at least one of said computing device and a first grid measuring device at least one of said requested measurement, and said requested analysis result,
wherein said request results from analysis of at least one measurement executed by said first grid measuring device, and
wherein said request comprises time of measurement and said time of measurement is associated with time of at least one measurement executed by said first grid measuring device.

14. The system according to claim 13, wherein said requested measurement is associated with a period of time around said time of at least one measurement executed by said second grid measuring device.

15. The system according to claim 14, wherein said period of time is not larger than time of travel of said transient between said measuring device detecting said transient and said proximal measuring device, according to speed of electric signal in a cable of said grid.

16. The system according to claim 13, wherein at least one of said computing device and a first grid measuring device is operative to communicate a request for a plurality of high-resolution measurements.

17. The system according to claim 16, wherein said resolution comprises at least one of time-resolution and repetition rate of said plurality of measurements.

* * * * *